United States Patent [19]

Gale et al.

[11] Patent Number: 4,859,934
[45] Date of Patent: Aug. 22, 1989

[54] APPARATUS FOR MEASURING THE FREQUENCY OF MICROWAVE SIGNALS

[75] Inventors: P. Michael Gale, Kanata; Myles McMillan, Wakefield; Andre Gagnon, Hull, all of Canada

[73] Assignee: Telemus Electronic Systems, Inc., Ontario, Canada

[21] Appl. No.: 108,627

[22] Filed: Oct. 15, 1987

[30] Foreign Application Priority Data

Oct. 15, 1986 [CA] Canada .................................. 520571

[51] Int. Cl.$^4$ ............................................ G01R 23/10
[52] U.S. Cl. ................................ 324/78 D; 324/78 F; 324/79 D
[58] Field of Search ...................... 324/78 D, 78 F, 84, 324/79 D; 364/484; 328/133, 134

[56] References Cited

U.S. PATENT DOCUMENTS

| | | | |
|---|---|---|---|
| 3,163,823 | 12/1964 | Kellis et al. | 324/79 D UX |
| 3,909,716 | 9/1975 | Dickers | 324/78 D |
| 3,983,559 | 9/1976 | Honoré et al. | 342/394 |
| 4,042,973 | 8/1977 | Caulfield et al. | 324/78 D X |
| 4,127,819 | 11/1978 | Keane | 331/9 X |
| 4,194,206 | 3/1980 | Tsui et al. | 324/78 F X |
| 4,547,727 | 10/1985 | Tsui et al. | 324/79 D |
| 4,559,602 | 12/1985 | Bates, Jr. | 364/513 X |
| 4,563,638 | 1/1986 | Dunn | 324/78 E X |
| 4,667,203 | 5/1987 | Counselman | 342/418 X |
| 4,675,684 | 6/1987 | Spence | 342/394 |
| 4,679,003 | 7/1987 | Sagawa et al. | 331/1 A |
| 4,680,540 | 7/1987 | Niki et al. | 324/78 D |
| 4,700,191 | 10/1987 | Manor | 342/13 |
| 4,751,576 | 6/1988 | Mehrgardt | 324/78 D X |
| 4,786,909 | 11/1988 | Payne | 342/94 |

FOREIGN PATENT DOCUMENTS

| | | |
|---|---|---|
| 1041614 | 10/1978 | Canada . |
| 1085925 | 9/1980 | Canada . |
| 1105574 | 7/1981 | Canada . |
| 1111114 | 10/1981 | Canada . |
| 1118849 | 2/1982 | Canada . |
| 1119702 | 3/1982 | Canada . |
| 1121006 | 3/1982 | Canada . |
| 1124337 | 5/1982 | Canada . |

Primary Examiner—Tom Noland
Attorney, Agent, or Firm—Antonelli, Terry & Wands

[57] ABSTRACT

A microwave frequency detection receiver utilizing a prescaler comprised of one or a plurality of cascaded analog frequency dividers for down-converting received microwave signals to a predetermined compressed radio frequency bandwidth, connected to a combined frequency discriminator and quantizer processor. The frequency discriminator can be either a single or multiple delay line discriminator or a two-stage feed forward digital instantaneous frequency measurement device. The receiver is characterized by wide radio frequency input bandwidth as well as accurate frequency measurement capability on short single pulse signals. Delay line discriminators can operate with high data rates and in a dense signal environment with a high probability of accurate signal frequency detection and measurement, and are thus suitable for use in electronic warfare systems.

21 Claims, 3 Drawing Sheets

APPARATUS FOR MEASURING THE FREQUENCY OF MICROWAVE SIGNALS

BACKGROUND OF THE INVENTION

This invention relates in general to microwave signal frequency measurement devices, and more particularly to a digital instantaneous frequency measurement receiver utilizing cascaded analog frequency dividers.

Various prior art systems have been developed for use in electronic warfare, for automatically measuring and displaying the frequency of microwave signals and thereby effect electronic support measures, electronic counter measures and electronic intelligence applications.

One prior art approach to microwave frequency measurements utilized a heterodyne converter frequency counter for mixing a predetermined harmonic of a local oscillator signal with an unknown frequency microwave input signal, resulting in sum and difference frequency signals. The heterodyne converter frequency counter measured the resulting difference frequency which was then counted directly by a digital counter. The exact frequency of the local oscillator and the value of the harmonic are both known, such that the resulting difference frequency forms a representation of the detected microwave signal frequency offset by a predetermined scaling factor proportional to the value of the harmonic.

Another well known prior art technique utilized a transfer oscillator which was tuned to a frequency for which the difference frequency between the unknown input signal and the predetermined harmonic of the local oscillator was reduced to zero. The frequency of the local oscillator was then directly measured by a digital counter and multiplied by a scaling factor corresponding to the value of the harmonic, and the resulting measured input signal frequency was then displayed.

It has been discovered that heterodyne conversion frequency counters are limited in their ability to measure the frequency of pulsed microwave signals, and while transfer oscillator frequency counters are capable of measuring pulsed microwave signals, they are typically incapable of measuring signals with large frequency modulation components.

In an effort to overcome the disadvantages of the aforementioned prior art systems, another prior art system was developed wherein a pluraity of analog microwave frequency dividers were utilized to down-convert the received microwave signal in octave steps into the frequency regions associated with digital frequency counters. The resulting frequency displayed by the frequency counter represented a measure of the input signal frequency reduced by a factor of $2^n$, where "n" corresponds to the number of cascaded frequency divider stages utilized.

This prior art system is described in Canadian Pat. No. 1,085,925 issued Sept. 16, 1980 and entitled Apparatus for Measuring the Frequency of Microwave Signals.

According to a successful implementation of the prior art system, a frequency divider chain was utilized to compress an input microwave signal frequency bandwidth of from 8 to 12 gigahertz down to a bandwidth of from 1 to 1.5 gigahertz. The down-converted signal was then detected by a gate control circuit for enabling a well known digital counter circuit, such as a GaAs counter, for a fixed time interval in response to the received down-converted signal having an amplitude in excess of a predetermined threshold. A time delay circuit was connected to the counter input to ensure that the down-converted signal was applied to the input of the counter simultaneously with the counter being enabled by the gate control circuit. The counter accumulated received microwave signal pulses during the aforementioned fixed time interval resulting in a measure of the down-converted input signal frequency represented symbolically by $F=N/T$, where "F" is the radio input signal frequency in gigahertz, "N" is the counter output value, and "T" is the fixed time interval in nanoseconds. The resulting measured frequency was then multiplied by the aforementioned factor of $2^n$, to arrive at a measure of the input microwave signal frequency.

For typical electronic warfare applications, the input microwave signal pulse widths are typically too narrow (eg. the minimum pulse width is typically less than 100 nanoseconds) for accurate measurement using standard digital counters, resulting in inaccurate frequency measurement.

The following table lists a measure of the frequency accuracy (in megahertz), for three radio frequency bandwidths of 8-12, 4-8 and 2-4 GHz for input signal pulse widths of 0.1, 1 and 10 microseconds.

TABLE 1

| | | FREQUENCY (GHz) | | |
|---|---|---|---|---|
| | | 8-12 | 4-8 | 2-4 |
| PW | 0.1 | ±80 | ±80 | ±40 |
| (μS) | 1.0 | ±8 | ±8 | ±4 |
| | 10.0 | ±0.8 | ±0.8 | ±0.4 |
| | | FREQUENCY ACCURACY (MHz) | | |

As seen from Table 1, for typical electronic warfare applications in which the input microwave signal pulse widths are less than 100 nanoseconds (i.e., 0.1 microseconds), the frequency accuracy is very low, (i.e., on the order of ±80 MHz for input microwave signals having frequencies from 4-12 GHz, and ±40 MHz for input microwave signal frequencies in the range of from 2-4 GHz).

One attempt to overcome the prior art frequency accuracy difficulties was to accumulate successive frequency measurements over several pulses, and then average the results. However, for typical electronic warfare applications wherein the pulse density is greater than 10 MPPS, this alternative is not frequently practical due to frequency de-interleaving of the multiple input microwave signals, and long throughput times (eg. 10 ms) for implementing the accumulation and averaging process.

SUMMARY OF THE INVENTION

According to the present invention, pulse frequency measurement is done on a pulse-by-pulse basis, with much greater accuracy and speed than the prior art approaches, and can therefore be advantageously used for electronic warfare applications.

A plurality of analog frequency dividers are cascaded according to the present invention, in a manner simimlar to the last mentioned prior art approach, and connected to a delay line frequency discriminator (DLFD) circuit for generating a time coincident video signal proportional in amplitude to the frequency of the input down-converted signal received from the cascaded frequency divider. The analog frequency signal is then converted into a digital format utilizing a flash analog-to-digital converter.

A significant advantage of utilizing a delay line frequency discriminator (DLFD) circuit in place of the digital counter according to the prior art, is that discriminator circuits are characterized by wide radio frequency input bandwidth as well as accurate frequency measurement capability on short single pulse signals. Delay line discriminators can operate with high data rates and in a dense signal environments with a high probability of accurate signal frequency detection and measurement, and are thus imminently suitable for use in electronic warfare systems.

DLFD circuits may be advantageously used in electronic support measure systems since the measured frequency is a very good descriptor of the received microwave signal pulses and therefore very efficient for use in sorting or de-interleaving pulse trains within a dense signal environment.

By utilizing microwave integrated circuit technology, DLFD circuits have become very compact and therefore suitable for airborne applications.

BRIEF DESCRIPTION OF THE DRAWINGS

A better understanding of the present invention will be obtained with reference to the detailed description below in conjunction with the following drawings in which.

DESCRIPTION OF THE PREFERRED EMBODIMENTS

Figure 1:
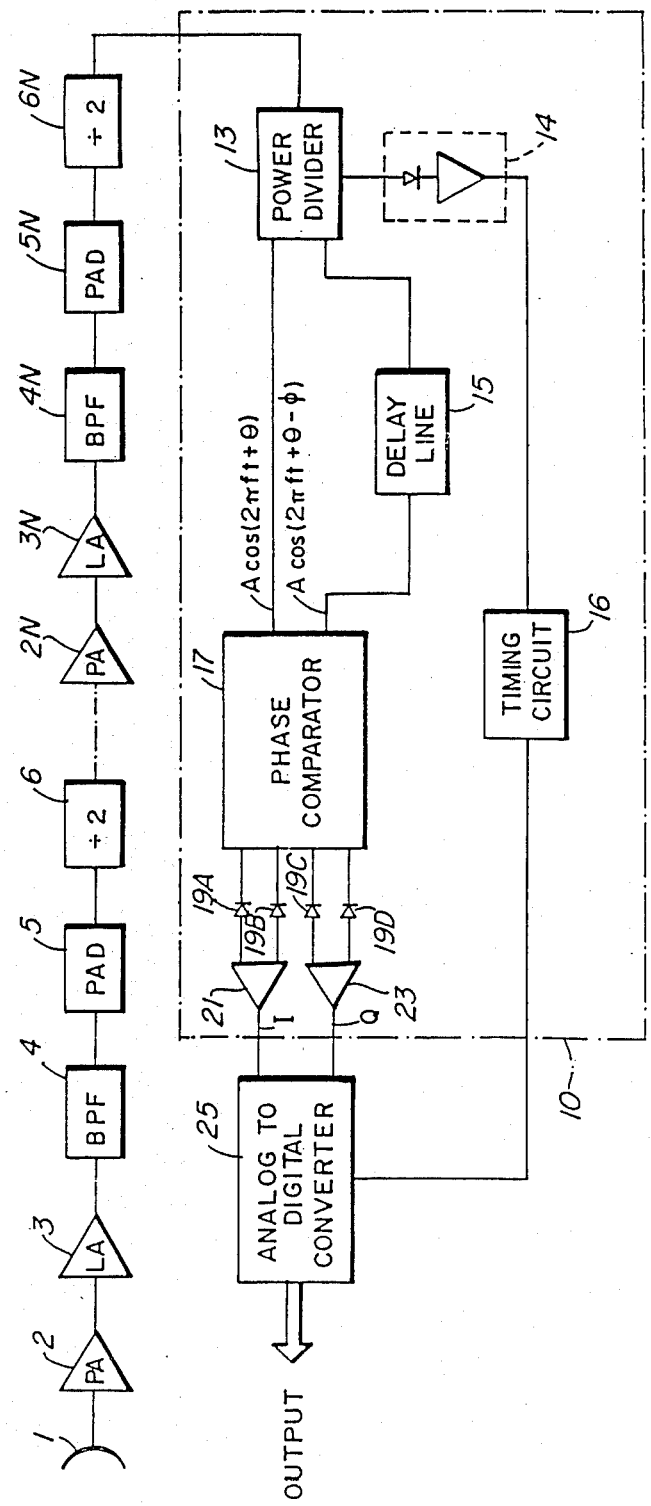
FIG. 1 is a block diagram illustrating apparatus for measuring the frequency of microwave signals according to the present invention in its most general aspect.

With reference to FIG. 1, an incoming microwave signal is received by an antenna 1 and applied to a cascaded analog frequency divider chain (or prescaler) comprised of a plurality (i.e., N) of series connected divider stages each including a power amplifier 2, limiting amplifier 3, bandpass filter 4, pad circuit 5 and balanced analog frequency divider 6.

Each of the series connected frequency divider stages directly transfers the incoming microwave frequency signals to lower radio (RF) frequency signals without the requirement of mixers or local oscillators. Hence, a plurality of such frequency divider stages connected in cascade can provide band compression factors of 2, 4, 8 or 16 depending on the number of stages used.

The analog frequency dividers 6...6N form an important aspect of the present invention, and are considered in greater detail below with reference to FIG. 3. However, in order to better understand the present invention, certain important characteristics of the analog frequency divider will be summarized.

Firstly, each of the analog frequency dividers require that the input signal applied thereto be in excess of a predetermined threshold radio frequency power before they are enabled. Below the threshold power, no division occurs. Once the input signal attains the threshold power, the divider is immediately enabled for frequency division. The threshold power is a function of a frequency and bias voltage applied to the frequency divider. The threshold power decreases with increasing frequency and decrease in bias. The frequency dividers typically require between +14 dBm and +18 dBm input signal power in order to turn on. With a small forward bias (0.5 volts), the turn on threshold can be reduced by approximately 8 to 10 dB.

A further important aspect of the frequency divider utilized in the present invention is that since no local oscillators and mixers are required, the division operation results in a compressed down-converted signal band in contrast to the output bandwidth characterized by prior art mixer schemes which is typically equal to the input signal bandwidth. Accordingly, an input signal bandwidth of from 2 to 4 GHz is compressed to a single bandwidth of from 1 to 2GHz according to the frequency divider of the present invention while no such bandwidth compression is obtained utilizing prior art heterodyne approaches. On the contrary, the fractional bandwidth is increased. Thus, the input fractional bandwidth would be 66.7% corresponding to one octave according to the prior art, and the output fractional bandwidth (eg., from 0 to 2 GHz) would have increased to 200%.

The frequency divider according to the present invention lends itself to instantaneous bandwidths which exceed an octave. Any signal present within the passband of the frequency divider will be divided.

Because of the threshold turn on power required for enabling the frequency divider, an input pulse which may have slow rise and fall times is "sharpened up" to produce a rectangular pulse output signal at half the input signal frequency.

Accordingly, an input signal may be either pulsed or continuous wave since the wide instantaneous bandwidth of the frequency divider allows the signal to be divided without any previous knowledge of the frequency of time-of-arrival of the signal.

A further advantage of the frequency divider of the present invention is that the down-conversion process is unaffected by temperature. Since the frequency halving process of the divider utilized in the present invention is one of subharmonic generation, the frequency divider will provide an output signal at precisely one half the frequency of the input signal, independent of the temperature of the device. In addition, the frequency divider instantaneous bandwidth and conversion loss are also relatively insensitive to temperature change.

The analog frequency divider utilized in the present invention is manufactured by Telemus Electronic Systems Inc., and sold under the trademark Halver TM. The Telemus frequency Halver TM circuit is described in greater detail in the aforementioned Canadian pat. No. 1,085,925; as well as in the following issued Canadian pat. Nos.: 1,041,614 entitled Broadband Frequency Divider Using Microwave Varactors; 1, 111, 114 entitled Microwave Division by Phase Lock Loops; 1,124,337 entitled Microwave Phase Lock Loops Using Fet Frequency Dividers; 1,105,574 entitled Broadband Microwave Frequency Divider for Division by Number Greater Than 2; 1,118,849 entitled Wideband Mess Fet Microwave Frequency Divider; 1,121,006 entitled Broadband Frequency Divider, and 1,119,702 entitled Parametric Frequency Division.

The Halver TM circuit is also available from Telemus Electronics Systems Inc., in the form of a microwave prescaler divider module, model 8600-T, for providing coherent down-conversion over the 1–12 GHz range in half octave bands, and offering fixed division ratios of 4, 8, 16 or 32.

Returning to FIG. 1, a first frequency divider stage is driven by an amplifier 2, with a 1 dB compression point of from +12 to +18 dBm approximately, which is sufficiently above the aforementioned turn on threshold. Each subsequent frequency divider stage utilizes an interstage amplifier (such as 2N), having a gain which compensates for the insertion loss of the previous frequency divider circuit. The compression point of such interstage amplifiers should preferable be from appoximately +3 to +5 dB above the turn on threshold of the subsequent frequency divider stages.

Each frequency divider stage also includes a limiting amplifier, (such as 3...3N), for increasing the input signal capture ratio in order to isolate a single signal in the event of simultaneous received signals. Also, a bandpass filter such as (4...4N) is included in each stage for rejecting any spurious and harmonic frequency signals.

Each stage also includes a pad circuit (5...5N) for matching the Halver TM circuit (6...6N) input impedance, and also to operate the Halver TM circuit within a recommended input power range. The recommended input power level (eg. from turn-on to spurious mode) is device dependent. Hence, the use of the pad circuit provides for individual tuning of the respective stages. It has been found that the best results are obtained when each stage is operated at around 4 dB above the aforementioned turn on threshold.

The balanced analog frequency divider or Halver TM circuit 6 is required to divide the incoming signal by 2. The Halver TM circuit is required to be balanced in order to elminate the generation of spurious in-band signals typically generated as a result of the reception of simultaneous microwave signals.

An amplifier (optional) may be inserted after the final Halver TM circuit 6N of the chain, in order to ensure a 50 ohm output impedance for correct impedance matching with a delay in line frequency discriminator, 10.

The signal from the final Halver TM 6N is applied to the delay line frequency discriminator 10. A power divider circuit 13 receives and splits the signal from Halver TM circuit 6 into a pair of identical reference signals which can be characterized by the following function with respect to time, t:

$$S = A\cos(2\pi ft + \tau),\text{ where:}$$

A represents the amplitude of the received signal,
f represents the frequency of the received signal,
$\tau$ represents the phase angle of the received signal.

For ease of discussion, it will be assumed that the amplitude A and phase angle $\theta$ of the received signal are constant.

The received signal is applied to a delay line 15, which in response generates a intermediate delayed signal of the form $S' = A\cos(2\pi ft + \theta - \theta)$, where $\phi$ represents the phase angle introduced by the delay line.

The reference signal S and delayed signal S' are applied to a phase comparator 17. The phase comparator is a passive component for introducing constant phase angles to each of the reference and delayed signals (S and S') and combining them to form four output signals according to well known techniques. The output signals are applied to four detectors 19A, 19B, 19C and 19D, and therefore to a pair of differential input video amplifiers 21 and 23 for converting the output signals from the four detectors to a pair of signals designed as $I = k\cos\phi$ and $Q = k\sin\phi$, where "k" is a constant.

The I and Q signals are applied to a analog-to-digital converter or quantizer 25 typically comprised of a bank of comparators (not shown) for generating a digital signal representative of the input phase angle $\phi$. Respective outputs of the comparators are connected to logic and processing circuits for manipulating the generated signal representation of the phase angle $\phi$ to yield a binary representation of the input frequency "f", since the phase angle is a linear function of the input frequency.

Thus, frequency discriminator 10 and quantizer 25 combine to form a processor for receiving an input down-converted analog signal and generating a digital output signal representative of the instantaneous input signal frequency.

In particular, $\phi = 2\pi f\tau$, where "f" represents the frequency of the input signal and $\tau$ represents the delay time imposed by delay line 15.

A threshold channel circuit 14 is connected to power divider 13 and is typically comprised of a detector and video amplifier connected to a timing circuit 16. The detected amplitude of the signal appearing at the input of power divider 13 is proportional to the signal power, and in the event this amplitude exceeds a predetermined threshold level, timing circuit 16 is triggered to generate an enable signal for enabling analog-to-digital converter 25 to initiate frequency measurement. After a short time delay for allowing the signal to propagate through the delay line discriminator channel, the video signals are quantized and stored, or applied to an output of converter 25 for display via a CRT screen, LED or LCD display, etc.

The discriminator 10 illustrated in Figure 1 is shown as being a single delay line discriminator. However, multiple delay line or other forms of discriminators can be used. The important aspect of the present invention is in the combination of a plurality of analog frequency divider circuits with a discriminator for instantaneous microwave frequency measurement.

Figure 2:
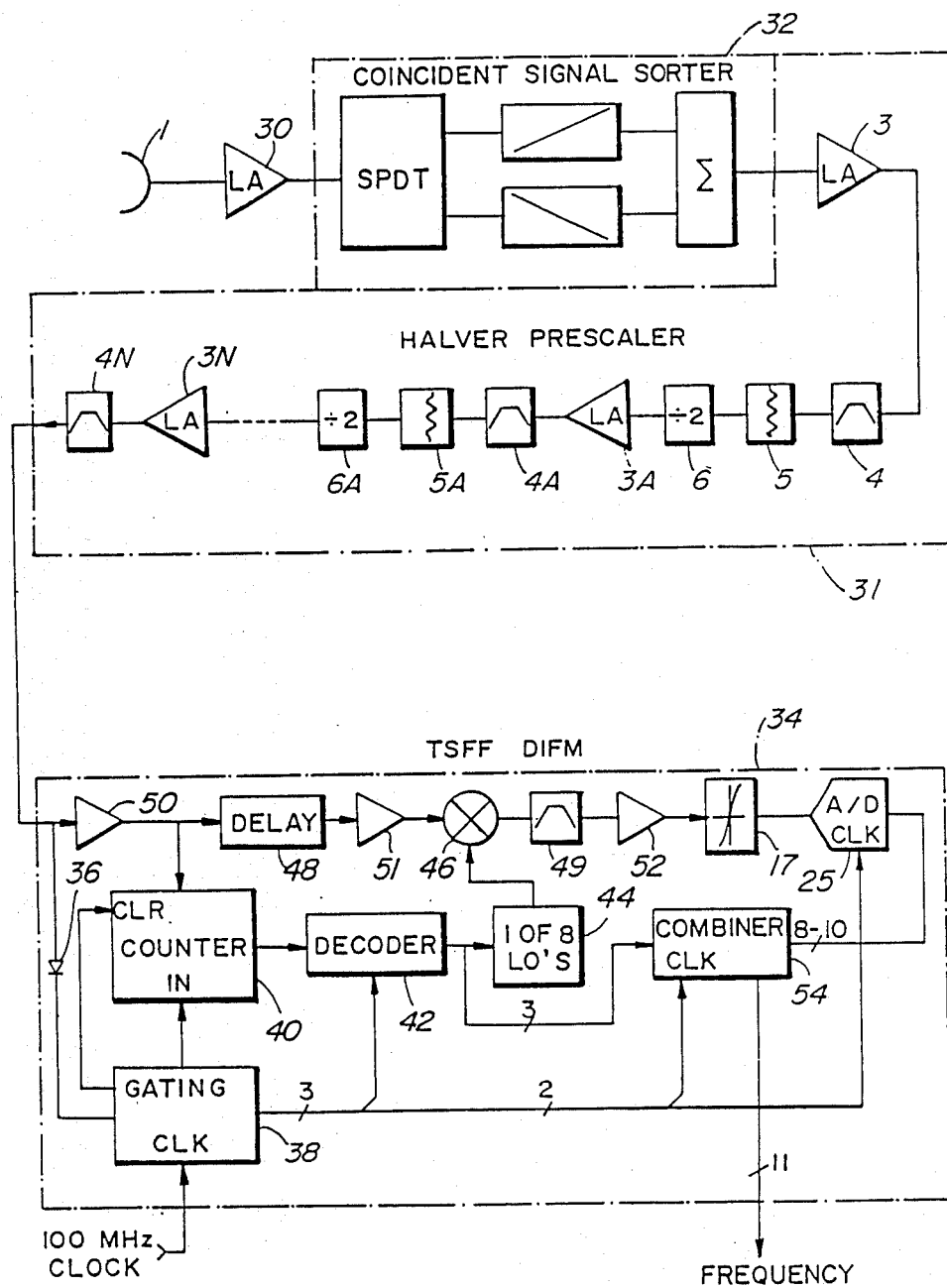
FIG. 2 is a block diagram of an apparatus for measuring the frequency of microwave signals according to an alternative embodiment of the present invention.

An alternative embodiment of the present invention is illustrated in FIG. 2, and is comprised of an antenna 1 for receiving the input microwave signal, an input limiting amplifier 30 for providing a constant power input signal to a Halver TM prescaler circuit 31, and a coincident signal sorter 32. The signal sorter 32 is typically comprised of an SPDT switch, a pair of signal modifying circuits such as high-pass and low-pass filters or oppositely poled dispersive delay lines, and a summing circuit. The coincident signal sorter separates simultaneous received microwave signals with respect to frequency in order that the simultaneous signals may be individually detected. The coincident signal sorter 32 is described in greater detail in applicant's copending Canadian patent application The output of the coincident signal sorter 32 is connected to the Halver TM prescaler circuit 31. A limiting amplifier 3 has an output connected to the input of a bandpass filter 4 which in turn is connected to pad circuit 5 and Halver TM circuit 6. Successive analog frequency divider circuits are cascaded as described above with reference to Figure 1, and the output of a final one of the stages is connected to the input of a two stage feed forward (TSFF) digital instantaneous frequency measurement (DIFM) receiver 34. The two stage feed forward (TSFF) DIFM is unlike standard delay line discriminators as discussed above with reference to FIG. 1, and which typically employ one or more delay lines and associated parallel support circuitry. The TSFF DIFM 34 exhibits superior performance over the well known delay line discriminator DIFMs for application involving high accuracy frequency measurements (eg. 11 bit resolution), and low pulse width signals (eg. 100 nanosecond minimum pulse width).

The input radio frequency signal output from the HalverTM prescaler circuit 31 or frequency divider chain, is split into two paths upon entering the TSFF DIFM 34. One path is used for frequency analysis and the other path is used for pulse analysis. Pulse and continuous wave (CW) control signals are obtained from AC and DC coupled RF detectors, shown diagrammatically by detector 36. These signals are combined with a stable high frequency external clock signal of approximately 100 megahertz to provide sequential timing for subsequent stages of the DIFM via a gating circuit 38.

Coarse frequency information is obtained by counting pulses of the down-converted RF signal (typically 1 to 1.5 GHz) applied to a standard GaAs digital counter 40 via input limiting amplifier 50. Counter 40 is enabled for a predetermined gate time of approximately 50 nanoseconds, as controlled by gating circuit 38.

The resulting pulse count from counter 40 is decoded via an 8-it decoder 42 for enabling one of eight local oscillators, shown diagrammatically as 44.

The received RF signal is further delayed by approximately 100 nanoseconds via delay circuit 48 and transmitted via limiting amplifier 51, for application to mixer 46 and mixed therein with a selected one of the eight local oscillators 44. The mixed signal is applied via bandpass filter 49 and limiting amplifier 52 to a frequency discriminator 17, such as the single delay line discriminator 10 described above with reference to FIG. 1.

The output of frequency discriminator 17 is an analog video signal which is digitized via analog-to-digital converter or quantizer 25, as discussed above, in order to obtain fine grain resolution of the detected microwave frequency. Digital frequency values representing the input radio frequency are generated by combining the outputs of the counter decoder 42 and quantizer 25 utilizing a combiner circuit 54. In response, the combiner circuit generates a high accuracy (eg. 11 bits) digital output signal representative of the input microwave signal frequency.

A successful prototype of the alternative embodiment was characterized by low cost (typically less than one half the price of existing prior art microwave signal frequency measurement receivers), small size (8"×8"×2"), high accuracy (11 bits) for detection of low microwave signal pulse widths (less than 100 nanoseconds), and was capable of displaying individual signal frequencies in the event of simultaneous coincident signals, as a result of using the aforementioned coincident signal sorter 32.

Figure 3:
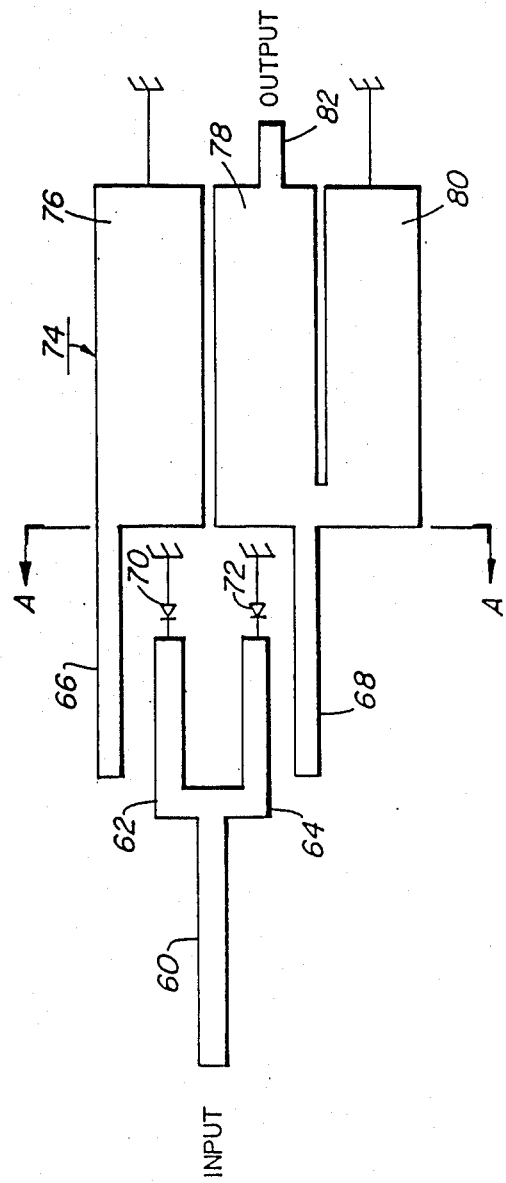
FIG. 3 is a plan view of an analog frequency divider for use in the apparatus according to the present invention.

Referring to FIG. 3, there is shown a diagram of an analog frequency divider in accordance with the HalverTM circuits illustrated in FIGS. 1 and 2.

A plurality of strip line or microstrip transmission lines 60, 62, 64 and 68 consisting of metal conducting strips are disposed on a dielectric substrate (not shown). On the other side of the dielectric substrate, away from the conducting microstrip transmission lines, and to the left of the demarcation line A—A, lies a metallic ground plane (not shown).

Microstrip transmission lines 62 and 64 are terminated at one end of microwave varactor diodes 70 and 72, respectively. Each of the varactors is preferably a galvanic parametric amplifier varactor having variable capacitance which varies in a non-linear fashion in response to a voltage applied thereacross.

Microstrip transmission lines 66 and 68 extend into a co-planar balun, or balanced input signal to unbalanced output signal device, shown generally as 74.

The balum 74 consists of metal conductor strips 76, 78 and 80 which are disposed on the aforementioned dielectric substrate. However, the balun 74 has no ground plane metallic conductor disposed beneath the dielectric substrate. Instead, conductor strips 76 and 80 are grounded at an end thereof, while conductor strip 70 is extended via microstrip conductor 82 to form an output terminal.

In operation, an input microwave signal is applied to microstrip transmission line 60. The input signal is applied therefrom to the circuit comprising microstrip transmission lines 62 and 64 and varactors 70 and 72 which form a basic resonant circuit which supports oscillation at one half of the frequency appearing on the input line 60. Thus, microstrip transmission lines 62 and 64 in combination with varactors 70 and 72 form a subharmonic frequency generator with a balanced output signal.

In general, the length of lines 62 and 64 will correspond to an electrical length of somewhat less than the signal wavelength at resonant frequency. Routine experimentation may be used to determine appropriate dimensions.

The signals appearing on transmission lines 62 and 64 are electromagnetically coupled to lines 66 and 68 and transmitted therefrom to the balun 74 and threfore to unbalanced output line 82.

Thus, a balanced input signal is converted via the frequency divider or HalverTM circuit of Figure 3 into an unbalanced signal having an output frequency equal to one half the input frequency.

The generation of a subharmonic frequency by the HalverTM circuit is a result of the specific non-linear nature of the varactors 18 and 19 in the basic resonant circuit. For a more detailed description of the theoretical basis for generation of the frequency divided signals, the reader is referred to the aforementioned Canadian pat. No. 1,041,614.

Various modifications of the frequency divider circuit are possible. For instance, the transmission lines 60, 62 and 64 can be separated from one another via an optional DC blocking chip capacitor located therebetween. Such a capactior would function as a short circuit at microwave frequencies. Also, a reverse DC bias voltage should be applied to one or both of the varactors 70 and 72 to ensure that they will not conduct current. To this end, a DC bias network is typically provided for applying a DC source and return to the varactor diodes in order that the varactors do not accumulate charge and become biased out of the correct region of operation.

The DC blocking chip capacitor is then utilized to prevent the passage of DC current.

The entire microstrip and coplanar balun circuit 74 may be intentionally skewed with respect to its substrate. This permits the input and output connectors to transmission lines 60 and 82 to be located on the center line of a metal enclosure box (not shown) which typically holds the entire device.

A further alternative embodiment of the frequency divider is realized using coplanar wave guides wherein the microstrip transmission lines and ground plane and all other conducting layers are on the same side of the dielectric substrate.

All such alternative embodiments are described in the aforementioned Canadian Pat. No. 1,041,614.

In summary, according to the present invention, apparatus is provided for measuring pulse or continuous wave microwave frequencies with high accuracy or resolution. According to the alternative embodiment, simultaneous coincident signals are separated and individually analyzed for determining their respective frequencies. In contrast to prior art microwave frequency measurement receivers, the apparatus according to the present invention is capable of measuring the frequency of very short pulse width signals virtually instantaneously. The apparatus is low cost and typically occupies very litle circuit board area and consumes very little power.

A person understanding the present invention may conceive of other embodiments or modifications thereof.

For instance, as discussed above, the single delay line discriminator circuit 10 illustrated in FIG. 1, may be replaced by a well known multiple delay line discriminator for improving the frequency resolution without ambiguity. In this case a multiple channel receiver with predetermined delay line ratios is provided in which long delay line ambiguities are resolved by sequential or parallel measurements on shorter delay lines, according to well known DIFM techniques.

These and other embodiments are considered to be within the sphere and scope of the present invention as defined by the claims appended hereto.

We claim:

1. Apparatus for measuring the frequency of microwave signals, comprised of one or a plurality of cascaded analog frequency dividers for receiving an incoming microwave signal having a frequency in a predetermined microwave bandwidth, and down-converting said received signal to a lower frequency within a predetermined compressed bandwidth, a combined frequency discriminator and quantizer processor operable on signals in said predetermined compressed bandwidth, for receiving said down-converted signal and generating a digital output signal representative of the frequency of said incoming signal, in response thereto.

2. Apparatus as defined in claim 1, wherein said combined frequency discriminator and quantizer processor is comprised of means for receiving said down-converted signal and generating a plurality of equivalent signals, one or more frequency discriminator circuits, each characterized by a respective predetermined input signal bandwidth, for receiving respective ones of said equivalent signals and generating respective output analog signals having amplitudes proportional to the frequency of the received signal present in said respective input signal bandwidths, and a quantizer for receiving said output analog signals and generating said digital output signal in response thereto.

3. Apparatus as defined in claim 2, wherein said one or more frequency discriminator circuits are each comprised of a delay line circuit connected to a phase comparator for receiving and delaying said down-converted signal by a predetermined amount, comparing said received and delayed signals and generating a video signal proportional in amplitude to the frequency of said down-converted signal in response thereto.

4. Apparatus as defined in claim 2, wherein said means for receiving is comprised of a power divider circuit.

5. Apparatus as defined in claim 1, wherein said combined frequency discriminator and quantizer processor is comprised of a two-stage feed forward digital instantaneous frequency measurement receiver.

6. Apparatus as defined in claim 5 wherein said two-stage feed forward digital instantaneous frequency measurement receiver is comprised of:
(a) means for measuring the number of cycles of said input signal for a predetermined length of time and generating a pulse count signal in response thereto,
(b) means for receiving and decoding said pulse count signal and enabling one of a plurality of local oscillators for generating a predetermined local oscillator signal in response thereto,
(c) means for mixing said input signal with the local oscillator signal and generating an intermediate frequency signal in response thereto,
(d) discriminator means for receiving said intermediate frequency signal and generating an analog video signal having an amplitude proportional to the frequency of said input signal, in response thereto,
(e) means for receiving said analog video signal and generating a digital fine grain frequency measurement signal in response thereto, and
(f) means for combining said decoded pulse count signal and said digital fine grain signal and generating said digital output signal representing the input signal frequency, in response thereto.

7. A frequency measurement receiver as defined in claim 6, wherein said means for measuring is comprised of an 8-it GaAs digital counter, and said predetermined length of time is 50 nanoseconds.

8. A frequency measurement receiver as defined in claim 6, wherein said means for receiving and decoding is comprised of a one-of-eight decoder circuit for generating a 3-bit enable signal.

9. A frequency measurement receiver as defined in claim 6, including eight local oscillators.

10. A frequency measurement receiver as defined in claim 6, wherein said intermediate frequency signal is in the vicinity of 160 MHz.

11. A frequency measurement receiver as defined in claim 6, wherein said discriminator means is comprised of a single delay line frequency discriminator.

12. A frequency measurement receiver as defined in claim 6, wherein said discriminator means is comprised of a multiple delay line frequency discriminator.

13. A frequency measurement receiver as defined in claim 6, wherein said means for generating said digital fine grain frequency measurement signal is comprised of an analog-to-digital converter.

14. A frequency measurement receiver as defined in claim 6, further including gating control circuitry for receiving and threshold detecting said input signal, and generating an enable signal for said predetermined length of time for enabling said means for measuring, in the event the amplitude of said input signal is greater than a predetermined threshold value.

15. A frequency measurement receiver as defined in claim 6, further including a 100 nanoseconds delay circuit connected to the input of said means for mixing.

16. Apparatus as defined in claim 5, comprised of four frequency dividers for down-converting said microwave signals from a predetermined microwave bandwidth of from 8GHz to 12 GHz to a compressed bandwidth of from 0.5 GHz to 0.75 GHz.

17. Apparatus as defined in claim 16, wherein each of said four frequency dividers is comprised of an input limiting amplifier, bandpass filter, pad resistance means and balanced microwave broadband frequency Halver circuit, connected in series.

18. Apparatus as defined in claim 1, further including a threshold detector circuit for detecting said incoming signal and in response to detection of an incoming signal amplitude greater than a predetermined threshold, generating a control signal for enabling said combined frequency discriminator and quantizer process to commence frequency measurement.

19. Apparatus as defined in claim 1, comprised of four frequency dividers for down-converting said microwave signals from a predetermined microwave bandwidth of from 8 GHz to 12 GHz to a compressed bandwidth of from 0.5 GHz to 0.75 GHz.

20. Apparatus as defined in claim 1, wherein each of said one or a plurality of frequency dividers is comprised of an input limiting amplifier, bandpass filter, pad resistance means and balanced microwave broadband frequency Halver TM circuit, connected in series.

21. A two-stage feed forward digital instantaneous frequency measurement receiver for measuring the frequency of an input signal, comprised of:
 (a) means for measuring the number of cycles of said input signal for a predetermined length of time and generating a pulse count signal in response thereto.
 (b) means for receiving and decoding said pulse count signal and enabling one of a plurality of local oscillators for generating a predetermined local oscillator signal in response thereto,
 (c) means for mixing said input signal with the local oscillator signal and generating an intermediate frequency signal in response thereto,
 (d) discriminator means for receiving said intermediate frequency signal and generating an analog video signal having amplitude proportional to the frequency of said input signal, in response thereto,
 (e) means for receiving said analog video signal and generating a digital fine grain frequency measurement signal in response thereto, and
 (f) means for combining said decoded pulse count signal and said digital fine grain signal and generating a digital output signal representing the input signal frequency, in response thereto.

* * * * *